United States Patent [19]

Probst et al.

[11] Patent Number: 5,626,688
[45] Date of Patent: May 6, 1997

[54] SOLAR CELL WITH CHALCOPYRITE ABSORBER LAYER

[75] Inventors: Volker Probst; Joerk Rimmasch, both of Munich; Hauke Harms, Salem, all of Germany

[73] Assignee: Siemens Aktiengesellschaft, Munich, Germany

[21] Appl. No.: 565,978

[22] Filed: Dec. 1, 1995

[30] Foreign Application Priority Data

Dec. 1, 1994 [DE] Germany .................. 44 42 824.3

[51] Int. Cl.$^6$ .................. H01L 31/072; H01L 31/0392; H01L 31/18
[52] U.S. Cl. .................. 136/265; 136/264; 427/76; 257/184; 438/95
[58] Field of Search .................. 136/264, 265; 437/5, 81–82; 427/76; 257/184, 607, 613; 204/192.25

[56] References Cited

U.S. PATENT DOCUMENTS

| | | | |
|---|---|---|---|
| 4,004,342 | 1/1977 | Park et al. | 437/3 |
| 4,818,357 | 4/1989 | Case et al. | 204/192.25 |
| 5,137,835 | 8/1992 | Karg | 437/5 |
| 5,141,564 | 8/1992 | Chen et al. | 136/258 |
| 5,296,674 | 3/1994 | Praschek et al. | 219/121.69 |
| 5,422,304 | 6/1995 | Kohiki et al. | 437/105 |
| 5,445,847 | 8/1995 | Wada et al. | 427/74 |
| 5,474,622 | 12/1995 | Negami et al. | 136/265 |
| 5,506,426 | 4/1996 | Kohiki et al. | 257/188 |

*Primary Examiner*—Aaron Weisstuch
*Attorney, Agent, or Firm*—Hill, Steadman & Simpson

[57] ABSTRACT

A substrate-independent manufacturing method for a solar cell with chalcopyrite absorber layer (4, 5) is proposed wherein a desired alkali content is obtained in the finished absorber layer by dosed addition of Na, K, or Li during the manufacturing process. An additional drive-in of alkali ions from a potentially alkali-containing substrate (1) is prevented by providing a diffusion barrier layer (2) between substrate and absorber layer.

20 Claims, 2 Drawing Sheets

SOLAR CELL WITH CHALCOPYRITE ABSORBER LAYER

BACKGROUND OF THE INVENTION

The present invention generally relates to solar cells. More particularly, it relates to new and improved solar cells including an alkali metal doped chalcopyrite absorber layer.

A principal goal in photovoltaics is development of solar cells exhibiting good long-term stability and high efficiency coupled with low manufacturing costs. Only by achieving these combined characteristics can this form of generating energy be competitive with other, conventional methods.

Solar modules of single-crystal silicon are currently considered the standard with respect to efficiency and long-term stability.

Promising beginnings for manufacturing solar cells at beneficial cost with long-term stability are currently suspected for solar cells including polycrystalline I-III-VI$_2$ chalcopyrite semiconductors. In particular, CuInSe$_2$ (CIS) and related alloys from the system CuIn(Ga)Se$_2$(S$_2$)(= CIGS) are materials that comprise a high absorption coefficient, a direct band transition, and a band gap matched to the solar spectrum. They can be manufactured by cost-beneficial thin-film deposition methods and have already achieved efficiencies of above 17% in laboratory tests.

A standard cell structure is composed of a stacked laminate including a glass substrate, a molybdenum back electrode, a 1–5 μm thick absorber layer of polycrystalline chalcopyrite semiconductor, a thin cadmium sulfide window layer, and a transparent front electrode.

It has been shown that record efficiencies can only be obtained with solar cells that are manufactured on alkali-containing glass substrates, for example, calcium soda-lime glass. A negative influence on the grain growth of the chalcopyrite absorber layer is found with other substrate materials. Given manufacturing conditions that are otherwise identical, fine-grain crystalline layers having average grain diameters of approximately 200 nm are obtained with other substrate materials. Additionally, especially fine-grain crystals having a maximum size of approximately 50 nm and different coverage area form at the surface of the chalcopyrite layer. These cause a reduction of the cell current, of the maximally obtainable no-load voltage, of the short-circuit current densities, and of the fill factor.

Contaminants deriving from the substrate are suspected as the cause for the dependency of the solar cell properties. Since the substrate is heated close to the softening point in the layer formation of the absorber layer, it is particularly alkali metal and alkaline earth metal ions that can diffuse out of the substrate into the semiconductor. Standard substrates of float glass comprise alkali metal and alkaline earth metal concentrations of about, for example, 13–15% sodium, 5–7% calcium, 4–5% magnesium, and 0.5–1% potassium.

The problem arises in the manufacture of solar cells with chalcopyrite absorber layer that the positive influence of calcium soda-lime glass on the cell properties is additionally dependent on the pre-treatment of the substrate material, for example on the cleaning of the surface, on the storage conditions with respect to moisture, duration, and temperature of both the uncoated substrates as well as the substrates coated with a molybdenum back electrode. The deposition conditions of the molybdenum back electrode also influence the solar cell properties. It is suspected that different deposition conditions primarily influence the diffusion behavior with respect to alkali and earth-alkali ions. Moreover, the amount of heat employed during manufacture of the chalcopyrite absorber layer is a further factor for the solar cell properties obtained.

It should be cited as a further disadvantage that the chalcopyrite layers often have poor adhesion on the molybdenum back electrode.

A 100% process control that is required for industrial scale manufacture of high-grade solar cells with chalcopyrite absorber layers is practically possible only with extremely great outlay.

SUMMARY OF THE INVENTION

It is therefore an object of the present invention to provide a method for manufacturing a solar cell with chalcopyrite absorber layer (4, 5) from the system CuIn(Ga)Se$_2$(S$_2$)(= CIGS) that eliminates the previously uncontrollable influence of the substrate on final properties of the solar cell and nonetheless leads to a solar cell having a morphologically well-pronounced absorber layer and good cell properties that allow maximum efficiencies.

The invention is based on the discovery that, contrary to prior belief, the efficiency and other properties of solar cells are improved by the presence of an alkali element in a chalcopyrite absorber layer. Setting a desired alkali content is not achieved in the invention, for instance, by promoting the alkali diffusion from an alkali-containing substrate but, by contrast, is achieved by complete suppression of alkali diffusion into the absorber layer and by dosed addition of an alkali metal or of an alkali metal compound during or after the generation of the back electrode layer.

The invention is based on the discovery that the positive effects only occur after a specific threshold of alkali concentration in the absorber layer is achieved. This threshold can be reliably reached and exceeded with the inventive method.

The invention also avoids the problem of deteriorated adhesion between the absorber layer and the molybdenum back electrode that otherwise usually arises, given elevated alkali concentration in the absorber layer.

Compared to any otherwise identical solar cell that comprises no alkali content in the chalcopyrite absorber layer, the following improvements in properties are achieved with the new and improved solar cell of the present invention:

The maximally obtainable open circuit voltage of the solar cell is increased by at least about 80 Mv to about 500 mV;

The short-circuit current densities reach more than about 40 mA/cm$^2$ and, thus, nearly the theoretically possible maximum value;

The fill factors rise from the previous maximum of 65% to more than about 70%;

The open circuit voltage of the solar cell is increased with even the slightest alkali content;

The adhesion of the absorber layer on a molybdenum back electrode is improved.

An absorber layer in accordance with this invention is preferably manufactured independently of the substrate and has a morphology advantageous for solar cells. More particularly, the absorber layer is coarse-grained and has average grain diameters in the layer thickness of from about 1 to about 5 μm. A fine-crystalline surface layer is also not formed, as was previously observed given absorber layers on alkali-free substrates. In accordance with a major advantage of this invention, a greater selection of suitable substrates is now available for the inventive method.

In accordance with the present invention, the alkali content of the absorber layer is critical for the increase in efficiency of the solar cell. A simple method for controlling the alkali content is made available for the first time with the inventive method. The method reliably leads to solar cells having suitable alkali content in the absorber layer, which is what initially enables higher and highest efficiencies of the solar cell to be achieved.

More particularly, the desired alkali content of the absorber layer is preferably set in a boundary surface region of the back electrode. Experiments have shown that the introduction of alkali metals or compounds proceeding from the surface of the absorber layer results in an increase in the efficiency of solar cells. A solar cell having constant alkali content over the thickness of the absorber layer, however, is also improved compared to a solar cell with alkali-free absorber layer.

The introduction of the desired quantity of alkali may be provided by dosed addition of elemental sodium, potassium, or lithium. The addition of alkali metal may be performed by evaporation from an effusion cell or from a linear evaporator.

However, the desired alkali content is preferably provided by dosed addition of a suitable alkali compound. In particular, suitable alkali metal compounds are compounds formed from an alkali metal, e.g., Na, K, and Li, with oxygen, sulfur, selenium, or the halogens. Since sulfur and selenium are already constituents of the chalcopyrite semiconductor, these compounds with the alkali elements are especially preferred because they do not lead to additional contamination in the absorber layer.

The deposition of the alkali compounds is preferably performed by sputtering or evaporation. An alkali compound target or a mixed target of the alkali compound and a copper selenide $Cu_xSe_y$ or a mixed target composed of the alkali compound with an indium selenide $In_xSe_y$ may be employed. A mixed metal-alkali target such as Cu/Na, Cu-Ga/Na, or In/Na likewise may be used.

The introduction of sodium, potassium, or lithium can also be performed during the sputtering of the back electrode from a metal target laced with the alkali element.

The suitable alkali content is dependent on the layer thickness and on the manufacturing method of the chalcopyrite absorber layer that defines the obtainable grain sizes. For a two-stage manufacturing method via a layer formatting with initial components and subsequent conversion into the composite semiconductor by rapid thermal annealing, a dose defined with respect to the surface area of the solar cell of from about $10^{14}$ to about $10^{17}$ atoms of alkali per $cm^2$ has proven advantageous. Deteriorated adhesion may occur at concentrations higher than this.

The control of the deposited quantity of alkali may be obtained by a calibrated piezoelectric resonator measurement, by absorption spectroscopy, or by mass spectrometry.

Given employment of an alkali-containing substrate, particularly of a glass substrate, additional alkali diffusion from the substrate into the absorber layer during the manufacture thereof is prevented in accordance with this invention by a diffusion barrier layer. Thin layers of silicon nitride, titanium nitride, aluminum oxide, $SiO_2$, $TiO_2$, or $ZrO_2$ are suitable for this purpose. An electrically insulated diffusion barrier layer of aluminum oxide, silicon dioxide, titanium oxide, or zirconium oxide can be provided or deposited directly over the substrate.

The diffusion barrier layer should not be injured by structuring procedures before the production of the absorber layer. Since thin aluminum oxide and silicon dioxide layers are transparent in the visible range, a laser structuring proceeding from the backside through the substrate may be performed given the employment of optically transparent substrates. Such a method is disclosed, for example, by EP-A 0 536 431. A further structuring method with which the diffusion barrier layer is not injured is the lift-off technique. The application of a mask technique in the deposition of the back electrode also does not lead to any injury of the diffusion barrier layer.

A diffusion barrier layer of conductive material may be provided between the substrate and the back electrode or between the back electrode and the absorber layer, if desired, for making a series connection. However, this should be structured together with the back electrode. In order to prevent a diffusion of alkali during the formation of the absorber layer, the common structuring of back electrode and diffusion barrier layer should not ensue until after the production of the absorber layer.

An adequate barrier effect is produced by thin silicon nitride, titanium nitride, aluminum oxide, titanium oxide, or zirconium oxide layers approximately 20–100 nm thick.

The diffusion barrier layers can be applied large-area, stoichiometrically, and densely with known deposition methods such as sputtering from compound targets or by reactive sputtering of elementary targets.

In accordance with a further embodiment of the invention, a back electrode having a complete barrier effect relative to alkali ions is selected which therefore serves as diffusion barrier layer. An additional diffusion barrier layer is not required in this embodiment. Such a back electrode can be fashioned, for example, completely of titanium nitride. It is also possible to fashion such a back electrode with complete barrier effect of two layers; this, however, again corresponds to the above-described combination of back electrode/ electrically conductive diffusion barrier layer. The back electrode layer may comprise molybdenum, titanium, palladium, platinum, or compounds of any of the foregoing elements.

The invention shall be described in greater detail below with reference to exemplary embodiments and six figures appertaining thereto. In schematic cross sections, the FIGS. show the various possibilities of the invention for manufacturing a high-grade chalcopyrite absorber layer over an arbitrary substrate.

BRIEF DESCRIPTION OF THE PREFERRED EMBODIMENTS

Figure 1:
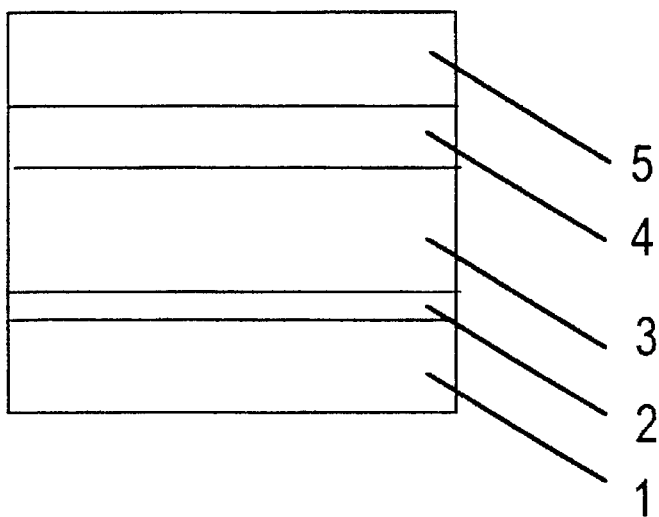
FIG. 1 Is a elevated cross-sectional view of a new and improved solar cell laminate in accordance with a first embodiment of the present invention.

Referring now to FIG. 1, a new and improved solar cell in accordance with the present invention is shown. A glass plate, for example of soda-lime glass, serves as alkali-containing substrate 1. A diffusion barrier layer 2 having a layer thickness of approximately 20–100 mm is deposited thereover. Aluminum oxide, titanium nitride, silicon dioxide, silicon nitride, titanium oxide, or zirconium oxide can serve as material for the diffusion barrier layer.

A back electrode 3 is then applied thereover, for example a roughly 1 μm thick molybdenum layer applied by sputtering.

In the next step, a chalcopyrite absorber layer having a desired alkali content is produced over the back electrode 3. The introduction of the desired alkali content itself is thereby dependent on the manufacturing method for the chalcopyrite absorber layer.

In the two-stage method, a multi-layer structure composed of initial components of the composite semiconductor is produced in the suitable layer thickness for the purpose, this containing the elements of the composite semiconductor in approximately the correct stoichiometry. In a second step, the initial components are converted to form the composite semiconductor. Initial components can thereby be layers of copper, indium, gallium, selenium or sulfur or their binary compounds with one another. In a variation of the two-stage method, the non-metallic components (sulfur or selenium) can be at least partly introduced via a corresponding atmosphere containing selenium or sulfur.

In a version independent of the manufacturing method of the compound semiconductor, the alkali element is preferably deposited On the back electrode 3 in the form of a sulfide or selenide. In the two-stage process, the multi-layer format composed of the components of the compound semiconductor is again produced thereover and is subsequently converted to form the composite semiconductor in a temperature step at temperatures of, typically, more than 500° C.

The structure shown in FIG. 1 is obtained, wherein an alkali-rich semiconductor layer 4 has formed under the semiconductor layer 5 poorer in alkali at the boundary surface to the back electrode 3.

Alternatively, the addition of the alkali compound can ensue by co-sputtering together with other components of the multi-layer structure.

In a single-stage method for manufacturing the absorber layer, the components are simultaneously evaporated and directly form the compound semiconductor on the hot substrate. In this case, the corresponding alkali compounds can be vapor-deposited in the starting phase simultaneously with the other components.

In a version independent of the manufacturing method of the absorber layer, the back electrode 3 is produced containing alkali, for example by sputtering metal targets that contain sodium, potassium, or lithium in addition to the back electrode material. In the temperature step necessary for the formation of the compound semiconductor, the drive-out of the alkali ions into the compound semiconductor then ensues, whereby the structure shown in FIG. 1 is again obtained.

Figure 2:
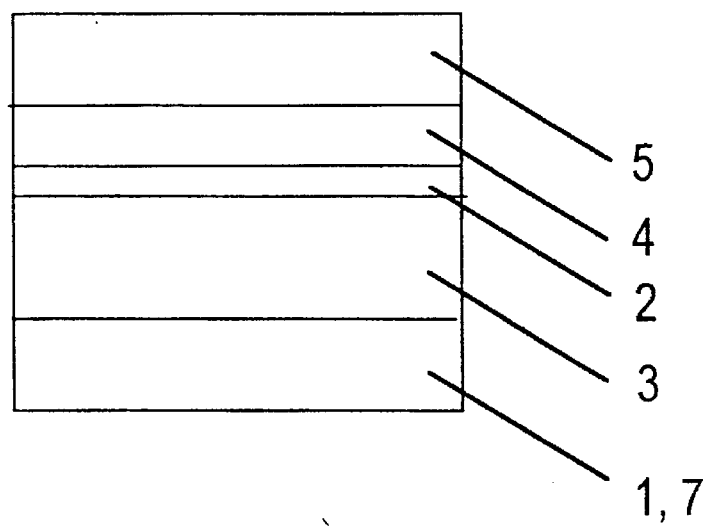
FIG. 2 is an elevated cross-sectional view of a new and improved solar cell laminate in accordance with a second embodiment of this invention.

FIG. 2 shows the result of an alternative method wherein the layer sequence with respect to back electrode 3 and diffusion barrier layer 2 is interchanged compared to FIG. 1. What is valid as a limiting factor in this version of the method is that the diffusion barrier layer is constructed of an electrically conductive material. For example, combinations of molybdenum with titanium nitride, palladium, or platinum or their compounds, particularly with silicon, thereby come into consideration as materials for back electrode 3 and diffusion barrier layer 2. The combinations of titanium or other electrode metals with titanium nitride are also suitable.

The generating of the absorber layer or, respectively, the introduction of an alkali content into the absorber layer 4, 5 can ensue as in the first exemplary embodiment.

Figure 3:
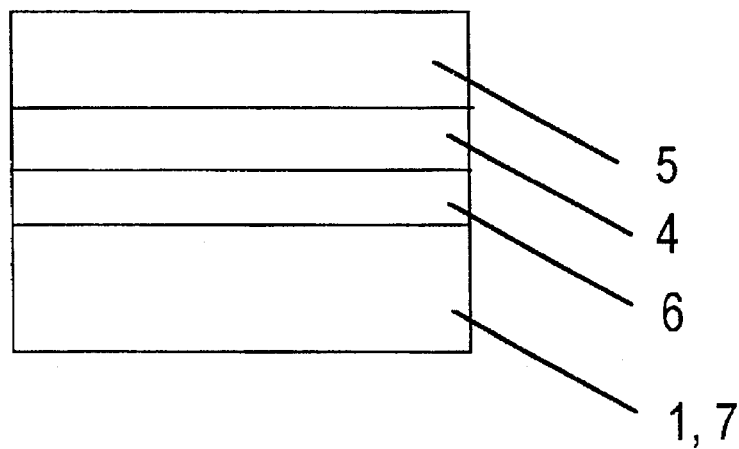
FIG. 3 is an elevated cross-sectional view of a new and improved solar cell laminate in accordance with a third embodiment of this invention.

FIG. 3 shows a layer structure wherein an alkali-containing absorber layer 4, 5 is arranged over a back electrode 6 and an alkali-containing substrate 1. Here, the back electrode 6 has a complete barrier effect with respect to alkali ion diffusion and can therefore simultaneously serve as diffusion barrier layer over alkali-containing substrates. Suitable materials for this back electrode 6 in addition to, in particular, titanium nitride are also materials suitable for the embodiment according to FIG. 2.

The production of the chalcopyrite absorber layer and the introduction of an alkali content into the absorber layer can ensue in the way already set forth. The dosing of an alkali element or, respectively, of an alkali compound in the region of the boundary layer to the back electrode 6 leads to an alkali-rich layer region 4 and an alkali-poor layer region 5 in the finished absorber layer 4, 5.

In the embodiments of FIGS. 2 and 3, wherein a diffusion barrier layer 2, 6 is arranged directly under the alkali-containing absorber layer 4, this diffusion barrier layer 2, 6 fulfills two further functions: it serves the purpose of producing an ohmic contact to the semiconductor or, respectively, to the chalcopyrite absorber layer 4 and also represents a diffusion and reaction barrier for elements and compounds that arise in the manufacturing process of the chalcopyrite absorber layer 4, 5 and could react with the back electrode. This is especially advantageous compared to these solar cells wherein a chalcopyrite absorber layer is produced directly above a molybdenum back electrode. Due to reaction with selenium or sulfur, i.e. with components of the chalcopyrite compound semiconductor, molybdenum sulfides and selenide could arise under the manufacturing conditions of the chalcopyrite absorber layer, these having a negative influence on the adhesion of the absorber layer over the back electrode, on the ohmic contact between back electrode and semiconductor, and on further electrical properties of the solar cells. According to this inventive embodiment, the manufacture of the semiconductor can therefore be largely decoupled from the chemical and physical properties of the back electrode. Reactions of the semiconductor with the back electrode, for example, and alloy formation with the semiconductor compounds of copper, gallium, or indium as well, are suppressed. For this reason, the embodiments of FIG. 2 and 3 are also meaningful for electrically insulating, alkali-free substrates 7.

Figure 4:
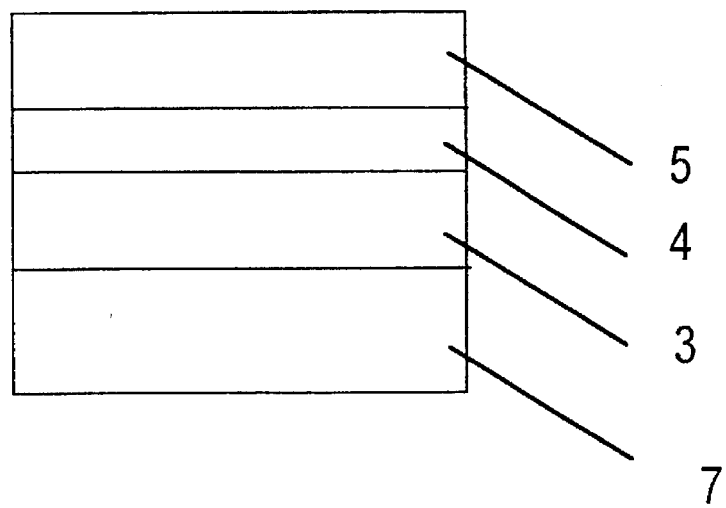
FIG. 4 is an elevated cross-sectional view of a new and improved solar cell laminate in accordance with a fourth embodiment of the invention.

FIG. 4 represents another layer structure having an alkali-free substrate 7. Ceramics and, in particular, aluminum oxide, zirconium oxide, or titanium oxide are suitable for this.

Since no diffusion barrier layer for alkali elements is inventively required here, the selection of materials for the back electrode 3 is also not subject to any limitations with respect thereto.

The production of the absorber layer ensues as set forth, whereby an alkali-rich layer region 4 and an alkali-poor layer region 5 are formed in the region of the boundary surface to the back electrode 3 by introducing an alkali content.

Figure 5:
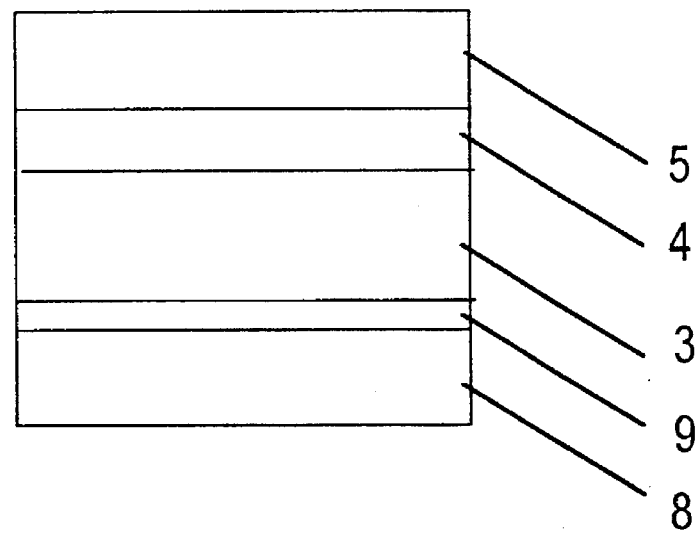
FIG. 5 is an elevated cross-sectional view of a new and improved solar cell laminate in accordance with a fifth embodiment of the invention.

In a further development of the invention, FIG. 5 shows a structure over a likewise alkali-free but electrically conductive substrate 8. For this embodiment, however, an additional insulator layer 9 is required between back electrode 3 and the substrate 8. It is a prerequisite for making it possible to have an integrated series connection of the later solar module on the basis of structuring. In addition to serving the purpose of electrical insulation, it also acts as reaction barrier between substrate and back electrode and, potentially, as a diffusion barrier for contaminants. Suitable materials for the insulator layer 9 are aluminum oxide, silicon oxide, or other temperature-stable insulators such as silicon nitride, zirconium oxide,or titanium oxide. The back electrode 3 can also be optionally replaced by the back electrode combinations 2 and 3 according to FIG. 2 or by the back electrode 6 of FIG. 3 in order to prevent a chemical reaction of the back electrode with the compound semiconductor 4, 5.

The deposition of back electrode 3 and of the absorber layer 4, 5 upon addition of sodium, potassium, lithium, or a corresponding alkali compound ensues as set forth. An alkali-rich layer region 4 and an alkali-poor layer region 5 are thus again formed in the absorber layer.

The further method for finishing the solar cells ensues according to known methods. For example, a 10–50 nm thick cadmium sulfide layer is generated as n-conductive window layer over the (p-conductive) absorber layer 5. Finally, the front electrode is deposited thereover, for example in the form of a 1.0 μm thick zinc oxide layer. In general, however, combinations with other window layers and other transparent front electrodes are possible.

In order to achieve an adequately high module voltage, the solar cell, finally, can also be interconnected in an integrated manner. To that end, every individual layer of the solar cell structure can be structured immediately after its manufacture. Care should always be taken during patterning or structuring so that the diffusion barrier layer is not injured before the production of the absorber layer. Even the most minute structural faults in the diffusion barrier layer can lead to an increase of the alkali concentration in the absorber layer after a tempering. Following tempering, if there is no damage or removal of the diffusion barrier layer along structuring lines, no undesirable increase in the alkali concentration results.

Figure 6:
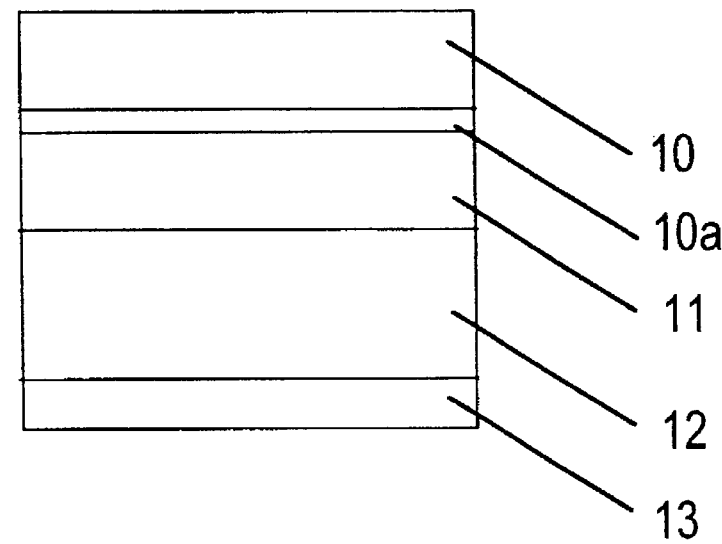
FIG. 6 is an elevated cross-sectional view of a sixth embodiment of a new and improved solar cell in accordance with the invention.

FIG. 6 shows a further development of the invention based on the concept of the superstrate cell. Given this cell, the light incidence ensues through the transparent substrate 10 that is potentially provided with a diffusion barrier layer 10a when alkali contaminants are present in the substrate 10. The substrate (composed of the layers 10 and 10a) is subsequently provided with a transparent front electrode 11 of TCO (Transparent Conductive Oxide) that, for example, can be composed of doped metal oxides such as tin or zinc oxide. The next process step is comprised in the production of an alkali-containing absorber layer 12. The solar cell manufacture is concluded with a metallic back electrode 13 that effects an ohmic contact to the compound semiconductor.

EXAMPLE

Exemplary embodiment: soda-lime substrate/60 nm $Al_2O_3$/Mo/$Na_2Se$/CIGS (also see FIG. 1).

A 60 nm $Al_2O_3$ layer is deposited from an $Al_2O_3$ composite target with radio-frequency sputtering onto a 2 mm thick soda-lime substrate immediately after the standard glass cleaning. The 60 nm $Al_2O_3$ here serves as diffusion barrier layer 2 for alkali contaminants from the soda-lime glass. Subsequently, a back electrode 3 is applied, for example, by sputtering 700 nm of molybdenum. The dosed introduction of alkali ions occurs here by complete evaporation from a precisely weighed quantity of $Na_2Se$ from a ceramic boat directly onto the molybdenum back electrode. The dose in this example amounts to $2\times10^{15}$ sodium ions per square centimeter of back electrode area. The chalcopyrite absorber layer in this embodiment is manufactured with a fast annealing process, being produced from the elementary copper, gallium, indium, and selenium layers. To that end, the metals are sputtered onto the sodium selenide in a mol ratio of Cu:(In+Ga) of about 0.89–0.96. Selenium is vapor-deposited with a stoichiometric excess of 25% and is reacted with the fast annealing process at, typically, 550° C., ten minutes in inert gas and encapsulation to form $CuIn(Ga)Se_2$. The elementary layer thicknesses can be varied such that absorber layer thicknesses from 1–3 μm, 2 μm in this case, arise. Any other technology, however, can also be utilized for producing the absorber, for example, tempering of the Cu/Ga/In layers in a reactive Se atmosphere or simultaneous evaporation of Cu, Ga, In, and Se.

For completing the solar cells, a 10–50 nm thin cadmium sulfide window layer is produced on the absorber layer 4, 5 according to known methods. Subsequently, a transparent front electrode, an approximately 1–1.5 μm thick ZnO layer is deposited with a CVD method, sand a grid of 50 nm Cr and 1 μm Al is vapor-deposited through a mask.

For comparison, solar cells were produced on soda-lime substrates with $Al_2O_3$ barrier layer but without the addition of sodium selenide. Without sodium, the efficiencies of the best cells remain below 5%; with sodium selenide, they are above 10%. In the comparison, the measured cell data in this example amount to:

without: η<5%, $V_{oc}$<425 mV, $I_{sc}$<21 mA/cm2, FF<56% with $Na_2Se$: η>10%, $V_{oc}$>445 mV, Isc>37 mA/cm2, FF>65%

We claim:

1. A solar cell comprising a chalcopyrite absorber layer including a controlled amount of a dopant selected from alkali metals and alkali metal compounds of from about $10^{14}$ to about $10^{17}$ alkali metal atoms per square centimeter of said chalcopyrite absorber layer.

2. A solar cell comprising:

a substrate having a surface;

a diffusion barrier layer disposed on said surface sufficient to prevent diffusion of alkali metal ions from the substrate across said diffusion barrier layer;

a back electrode layer disposed on said diffusion barrier layer;

a chalcopyrite absorber layer disposed on said back electrode layer, a lower portion of said chalcopyrite absorber layer adjacent said back electrode layer including a controlled amount of dopant selected from alkali metals and alkali metal compounds;

a window layer disposed on the chalcopyrite absorber layer; and a front electrode disposed on said window layer.

3. A solar cell as defined in claim 2, wherein said substrate includes alkali metal or alkaline earth metal contaminants.

4. A solar cell as defined in claim 2, wherein said substrate comprises glass.

5. A solar cell as defined in claim 2, wherein said diffusion barrier layer comprises TiN, $Al_2O_3$, $SiO_2$, $Si_3N_4$, $ZrO_2$, or $TiO_2$.

6. A solar cell as defined in claim 2, wherein said diffusion barrier layer has a thickness of from about 20 to about 100 nm.

7. A solar cell as defined in claim 2, wherein said back electrode layer comprises molybdenum, titanium, palladium, platinum, or compounds of any of the foregoing elements.

8. A solar cell as defined in claim 2, wherein said chalcopyrite absorber layer comprises $CuInSe_2$(CIS) or $CuIn(Ga)Se_2(S_2)$(=CIGS).

9. A solar cell as defined in claim 2, wherein said window layer comprises cadmium sulfide.

10. A solar cell as defined in claim 2, wherein said front electrode layer comprises a transparent conductive oxide.

11. A solar cell comprising:

an alkali-free substrate having a surface;

a back electrode disposed on said surface;

a chalcopyrite absorber layer disposed on said back electrode, a lower portion of said chalcopyrite absorber layer adjacent said back electrode layer including a controlled amount of a dopant selected from alkali metals and alkali metal compounds;

a window layer disposed on said chalcopyrite absorber layer; and a front electrode layer disposed on said window layer.

12. A solar cell as defined in claim 11, further comprising a diffusion barrier layer disposed intermediate said back electrode layer and said chalcopyrite absorber layer.

13. A solar cell as defined in claim 12, wherein said diffusion barrier layer is electrically conductive.

14. A method for making a solar cell, comprising the steps of:

providing a substrate having a surface;

depositing a diffusion barrier layer on the surface of the substrate capable of preventing diffusion of alkali metal ions from the substrate across said diffusion barrier layer;

depositing a back electrode layer on said diffusion barrier layer;

forming a chalcopyrite absorber layer including a controlled amount of a dopant selected from alkali metals and alkali metal compounds on said back electrode layer;

depositing a window layer on the chalcopyrite absorber layer; and depositing a front electrode layer on said window layer.

15. A method as defined in claim 14, wherein said chalcopyrite absorber layer comprises a compound semiconductor of $CuInSe_2$(CIS) or $CuIn(Ga)Se_2(S_2)$(=CIGS) and said forming step further includes the steps of sputtering targets to form a sputter deposited layer generally having appropriate stoichiometric amounts of each element, said targets being selected from the group consisting of copper, indium, gallium, selenium, sulfur, an alkali metal selected from sodium, potassium, lithium, and binary compounds of any of the foregoing to form said sputter deposited layer; and thereafter, heating the sputter deposited layer to temperatures above about 500° C. to convert the sputtered elements into said compound semiconductor chalcopyrite absorber layer.

16. A method as defined in claim 14, wherein said chalcopyrite absorber layer comprises a compound semiconductor of $CuInSe_2$(CIS) or $CuIn(Ga)Se_2(S_2)$ (=CIGS) and said foxing step further includes the steps of vapor depositing generally appropriate stoichiometric amounts of elements selected from the group consisting of copper, indium, gallium, selenium, sulfur, an alkali metal selected from sodium, potassium, lithium, and binary compounds of any of the foregoing elements to form a vapor-deposited layer; and thereafter, heating said vapor-deposited layer to a temperature above about 500° C. to convert the vapor-deposited elements into said compound semiconductor chalcopyrite absorber layer.

17. A method as defined in claim 14, wherein said chalcopyrite absorber layer comprises a compound semiconductor of $CuInSe_2$(CIS)) or $CuIn(Ga)Se_2(S_2)$ (=CIGS) and said forming step further includes the steps of sputtering or vapor depositing generally appropriate stoichiometric amounts of elements selected from Cu, In, Ga, Se, S, an alkali metal selected from the group consisting of Na, K, and Li, and binary compounds of any of the foregoing and wherein said stoichiometric amounts of Se or S are at least partially introduced by performing said sputtering or vapor depositing in an atmosphere comprising Se or S, respectively, to form a precursor layer; and thereafter, heating said precursor layer to temperatures above about 500° C. to convert the sputtered or vapor-deposited elements into said composite semiconductor chalcopyrite absorber layer.

18. A method as defined in claim 14, wherein said chalcopyrite absorber layer comprises a compound semiconductor of $CuInSe_2$(CIS) or $CuIn(Ga)Se_2(S_2)$ (=CIGS) and said forming step further includes the steps of depositing said controlled amount of dopant by sputtering or vapor depositing an alkali metal selected from the group consisting of Na, K, Li, and binary compounds of any of the foregoing with Se or S to form a first layer on said back electrode layer;

sputtering or vapor depositing generally appropriate stoichiometric amounts of elements selected from the group consisting of: Cu, In, Ga, Se, S, and binary compounds of any of the foregoing onto said first layer to form a second layer; and thereafter, heating to a temperature above about 500° C. to convert the first and second layers into said compound semiconductor chalcopyrite absorber layer.

19. A method for making a solar cell, comprising the steps of:

providing an alkali-free substrate having a surface;

depositing a back electrode layer on said surface;

forming a chalcopyrite absorber layer including a controlled amount of dopant selected from alkali metals and alkali metal compounds on said back electrode layer;

depositing a window layer on said chalcopyrite absorber layer; and depositing a front electrode layer on said window layer.

20. A method for making a solar cell as defined in claim 19, further comprising the step of depositing an electrically conductive diffusion barrier on said back electrode prior to said forming step.

* * * * *